United States Patent
Lv (10) Patent No.: US 8,718,107 B2
(45) Date of Patent: May 6, 2014

(54) BIAS CIRCUIT OF ELECTRO-ABSORPTION MODULATED LASER AND CALIBRATION METHOD THEREOF

(75) Inventor: Shusheng Lv, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 117 days.

(21) Appl. No.: 13/505,743

(22) PCT Filed: Jun. 1, 2010

(86) PCT No.: PCT/CN2010/073434
§ 371 (c)(1),
(2), (4) Date: May 3, 2012

(87) PCT Pub. No.: WO2010/145447
PCT Pub. Date: Dec. 23, 2010

(65) Prior Publication Data
US 2012/0269215 A1 Oct. 25, 2012

(30) Foreign Application Priority Data
Nov. 5, 2009 (CN) .......................... 2009 1 0207456

(51) Int. Cl.
*H01S 3/13* (2006.01)
(52) U.S. Cl.
USPC ............... 372/29.011; 372/28; 372/29.015; 372/38.02; 372/38.07
(58) Field of Classification Search
USPC .................. 372/28, 29.011, 29.015, 38.02
See application file for complete search history.

(56) References Cited

U.S. PATENT DOCUMENTS
5,917,637 A * 6/1999 Ishikawa et al. ............. 398/197

FOREIGN PATENT DOCUMENTS

| CN | 1188567 A | 7/1998 |
|---|---|---|
| CN | 1979235 A | 6/2007 |
| CN | 2917038 Y | 6/2007 |
| CN | 201178510 Y | 1/2009 |
| CN | 101702489 A | 5/2010 |

OTHER PUBLICATIONS

P.R. China, State Intellectual Property Office, International Search Report for International Application No. PCT/CN2010/073434 mailed Sep. 9, 2010.

* cited by examiner

*Primary Examiner* — Dung Nguyen
(74) *Attorney, Agent, or Firm* — Bright IP Law Offices (57) ABSTRACT

A bias circuit of an electro-absorption modulated laser and a calibration method thereof are provided. The bias circuit includes a drive circuit and a direct current bias voltage circuit. The drive circuit is used for providing a forward bias voltage to a laser diode in the electro-absorption modulated laser to generate laser. The direct current bias voltage circuit is connected to a cathode of an electro-absorption modulator in the electro-absorption modulated laser, and provides a positive direct current bias voltage to the cathode to enable the reverse bias voltage of the electro-absorption modulator to fall within the range of modulation. When the reverse bias voltage falls within the range of modulation, the electro-absorption modulator utilizes the laser generated by the laser diode as optical carrier wave, modulates the optical carrier wave with the modulation voltage, and outputs a modulated optical signal.

18 Claims, 4 Drawing Sheets

BIAS CIRCUIT OF ELECTRO-ABSORPTION MODULATED LASER AND CALIBRATION METHOD THEREOF

CROSS REFERENCE TO RELATED APPLICATIONS

This application is the U.S. National Stage of International Patent Application No. PCT/CN2010/073434 filed on Jun. 1, 2010, which claims priority to Chinese Patent Application No. 200910207456.4 filed on Nov. 5, 2009. Both the PCT Application and Chinese Application are hereby incorporated by reference in their entirety.

FIELD OF THE INVENTION

The disclosure relates to the technical field of optical fiber transmission, and in particular to a bias circuit coupled to an electro-absorption modulated laser and a calibration method thereof.

BACKGROUND OF THE INVENTION

With the development of optical communication, an optical transceiver module is used more and more widely in optical fiber communication systems. The optical transceiver module is a key technology of optical fiber communication systems and plays the role of realizing electrical to optical and optical to electrical conversion, thus its performance has a significant impact on that of optical fiber communication systems. An optical transceiver module usually employs an Electro-absorption Modulated Laser (EML); the EML mainly includes: a Photo-detector (PD), a Laser Diode (LD) and an Electro-absorption Modulator (EAM); the PD is used for converting an optical signal into an electrical signal; the LD is used for generating laser; in order to enable the LD to generate laser, a bias current must be injected into it, which means the bias current flows from anode to cathode of the LD; the EAM utilizes the laser generated by the LD as an optical carrier wave, modulates the optical carrier wave with a modulation voltage, and generates a modulated optical signal. The principle that the EAM modulates the laser generated by the LD is as follows: the EAM is added with an appropriate reverse bias voltage, and because of the nonlinear absorption property of the EAM, in the range of modulation of EAM, the absorption of light intensity of the EAM increases in an approximately exponential manner with an increase in the reverse bias voltage, so that only a very low optical power transmits when the reverse bias voltage increases. Thus, after being modulated by the EAM, the optical carrier wave output carries a modulation voltage signal.

Figure 1:
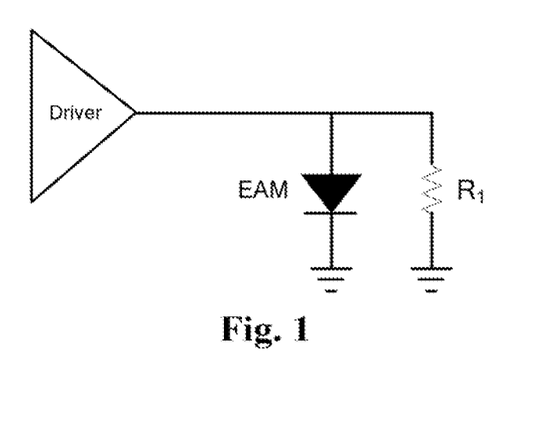
FIG. 1 shows a circuit diagram of DC coupling between the driver and the EAM in the existing EML.

In the traditional EML, there are two coupling modes between a driver for providing the modulation voltage and the EAM; one coupling mode is the traditional Direct Current (DC) coupling mode; as shown in FIG. 1, output of the driver is directly connected to the anode of EAM, and the cathode of the EAM is grounded; $R_1$ is a matching resistor and connected to two ends of the EAM. However, the driver and the EAM use a DC coupling mode; in order to achieve good indexes of high extinction ratio and dispersion cost, the amplitude of the alternate current signal output by the driver is required to be large enough, so the required power consumption of the driver is high, which causes the high power consumption of the EML.

Figure 2:
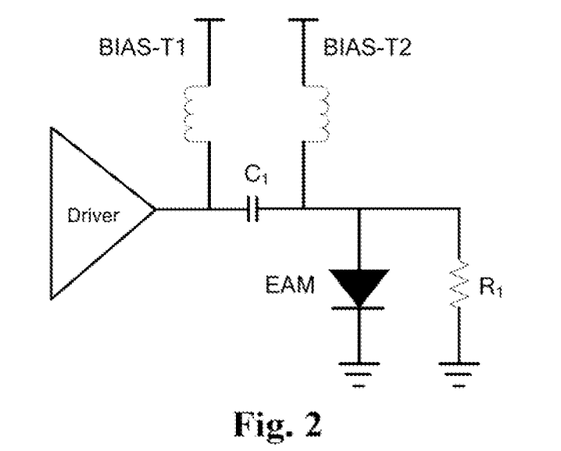
FIG. 2 shows a circuit diagram of AC coupling between the driver and the EAM in the existing EML.

The other coupling mode is the traditional Alternate Current (AC) coupling mode; as shown in FIG. 2, output of the driver is connected to the anode of EAM via the capacitor C1, and the cathode of the EAM is grounded; because of using the AC coupling mode, it is needed to add a DC bias voltage circuit BIAS-T1 to the driver and add a DC bias voltage circuit BIAS-T2 to the EAM, wherein the BIAS-T1 and BIAS-T2 are used for providing the DC bias voltage to the driver and the EAM, respectively, and are mainly composed of magnetic bead and inductor, for passing DC and blocking AC. Thus, when the driver and the EAM use the AC coupling mode, it is needed to add the DC bias voltage circuit (i.e. circuit BIAS-T2) to the EAM, so as to enable the reverse bias voltage of the EAM to fall within the range of modulation of EAM, which means that the absorption of light intensity of the EAM increases in an approximately exponential manner with increase of the reverse bias voltage.

The driver and the EAM use the AC coupling mode, which can reduce the power consumption of the driver; adding the DC bias voltage circuit to the EAM can ensure the stability of output optical power of the laser. However, the DC bias voltage circuit (BIAS-T2) in FIG. 2 is set between the driver and the EAM, and the DC bias voltage circuit in the traditional art generally includes components, such as inductor; because the used components are not ideal, the parasitic parameters are unavoidable, namely, there exist parasitic resistance and parasitic capacitance, which causes a high-frequency AC signal output by the driver to be shunted by the BIAS-T2, thereby the high-frequency AC signal to the EAM is lost; the loss causes large jitter of output optical carrier wave of the laser and small margin of eye-diagram module, which decreases high-frequency performance of the laser.

SUMMARY OF THE INVENTION

The disclosure provides a bias circuit of an EML and a calibration method thereof, used for providing a forward bias voltage to the LD in the EML and enable it to generate a bias current, and providing a DC bias voltage to the EAM; the bias circuit and calibration method thereof can reduce power consumption of the EML, optimize the AC coupling, and improve the high-frequency performance of the EML.

To achieve the objectives above, the disclosure provides a bias circuit of an EML, including:

a drive circuit, which is used for providing a forward bias voltage to a laser diode in the electro-absorption modulated laser, wherein the forward bias voltage enables the laser diode to generate laser; and a direct current bias voltage circuit, which is connected to a cathode of an electro-absorption modulator in the electro-absorption modulated laser, wherein the direct current bias voltage circuit is used for providing a positive direct current bias voltage to the cathode of the electro-absorption modulator and causing a reverse bias voltage of the electro-absorption modulator to fall within a predefined range of modulation such that, when the reverse bias voltage falls within the predefined range of modulation, the electro-absorption modulator utilizes the laser generated by the laser diode as an optical carrier wave, modulates the optical carrier wave with a modulation voltage, and outputs a modulated optical signal.

The disclosure further provides a calibration method based on the bias circuit of an EML, comprising the following steps:

regulating a direct current bias voltage circuit to provide a positive direct current bias voltage to a cathode of an electro-absorption modulator and cause a reverse bias voltage of the electro-absorption modulator to fall within a predefined range of modulation;

changing a preset power voltage and a gain of a first amplifier such that a differential signal output by a comparator corresponds to an optical power error signal; and utilizing the differential signal output by the comparator and a first voltage signal output by a bias current detecting circuit to control a voltage control signal output by a feedback controller, to ensure that a bias current detected by the bias current detecting circuit meet an output optical power requirement of the electro-absorption modulated laser.

The bias circuit of an EML and the calibration method thereof provided by the disclosure have the following beneficial effects:

1) because the cathode of the EAM is provided with the positive DC bias voltage, the amplitude of AC signal output by the driver is decreased, and the power consumption of the matching resistor is further reduced;

2) a ground wire is used to perform AC coupling with the cathode of the EAM, the existing components, such as inductor and magnetic bead, of the DC bias voltage circuit are abandoned, thereby the AC coupling is optimized, and the high-frequency performance of the EML can be improved; and 3) use of a feedback control circuit improves the quality of optical signal output by the EML, which means the jitter of the output optical signal is small, the margin of eye-diagram is large, and the dispersion cost is small, thereby improving the overall performance of the EML.

DETAILED DESCRIPTION OF THE EMBODIMENTS

The embodiment of a bias circuit of an EML and a calibration method thereof provided by the disclosure is described below with reference to the accompanying drawings in detail.

The bias circuit of an EML provided by the disclosure includes:

a drive circuit, which is used for providing an LD in the EML with a forward bias voltage, which enables the LD to generate laser; the LD in the EML is used for generating laser under the drive of the forward bias voltage; as described above, only based on the forward bias voltage, there is bias current existing, and then the LD can generate laser; and a direct current bias voltage circuit, which is connected to a cathode of an electro-absorption modulator in the electro-absorption modulated laser, wherein the direct current bias voltage circuit is used for providing a positive direct current bias voltage to the cathode of the electro-absorption modulator and causing a reverse bias voltage of the electro-absorption modulator to fall within a predefined range of modulation such that, when the reverse bias voltage falls within the predefined range of modulation, the electro-absorption modulator utilizes the laser generated by the laser diode as an optical carrier wave, modulates the optical carrier wave with a modulation voltage, and outputs a modulated optical signal. As described above, when the reverse bias voltage falls within the range of modulation, the absorption of light intensity of the EAM increases in an approximately exponential manner with increase of the reverse bias voltage, so that only a very low optical power transmits when the reverse bias voltage increases to achieve the aim of modulation. The DC bias voltage circuit provides a positive DC bias voltage to the cathode of the EAM to reduce the amplitude of AC signal output by the driver, thereby reducing the effective value of voltage applied to the matching resistor of the driver and the thermoelectric cooler, the power consumption of EML is reduced as a result of reducing the power consumption of the matching resistor. The thermoelectric cooler is used for reducing the temperature of chip of the EAM.

In the embodiment, a DC bias voltage circuit is connected between the EAM in the EML and the cathode of LD, the adjustable drive circuit is connected to the anode of LD, the DC bias voltage circuit is connected to the cathode of LD, the adjustable drive circuit provides the bias current to the LD, and the DC bias voltage circuit provides the positive voltage to the cathode of the EAM, i.e., adding the reverse bias voltage to the EAM. In this design, the DC bias voltage current is not between the EAM and the drive circuit, which ensures that the high-frequency AC signal output by the driver is not shunted; thereby the high-frequency AC signal to the EAM is not lost, ensuring the high-frequency performance of the laser.

The driver in the EML provides the modulation voltage to the anode of EAM, and is connected to the anode in a coupling mode, so the modulation voltage is the AC voltage with small amplitude.

Preferably, the bias circuit of EML further includes a ground wire, wherein the ground wire is in AC coupling with the cathode of the EAM, specifically, the cathode of the EAM is grounded through the capacitor which is used for passing AC and blocking DC. In this way, the existing components, such as inductor and magnetic bead, of the DC bias voltage circuit are eliminated, thereby the AC coupling is optimized, and the high-frequency performance of the EML can be improved. The cathode of the EAM in the EML is connected to the cathode of the LD.

The bias circuit of EML further includes a feedback control circuit, which utilizes the modulated optical signal as the first feedback signal and utilizes the bias current generated by the LD under drive of the forward bias voltage as the second feedback signal, and generates a voltage control signal $V_{CON}$ for controlling the drive circuit; under the drive of $V_{CON}$, the drive circuit regulates the forward bias voltage provided to the LD, so as to regulate the bias current in the LD; because the bias current determines the stability of output optical power, the feedback modulation system enables the optical power output by the EAM to be stable, and the quality of the optical signal output by EML is improved.

Figure 3:
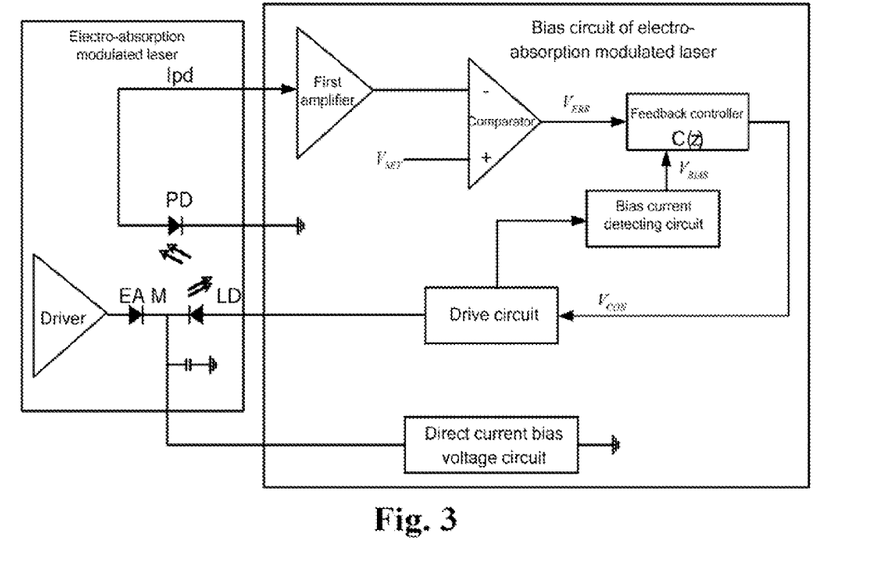
FIG. 3 shows an internal structural diagram of connection between the bias circuit of an EML and the EML in the embodiment of the disclosure.

According to the bias circuit of EML in embodiment 1 of the disclosure, as shown in FIG. 3, the bias circuit of EML includes: a drive circuit, which is connected to the anode of the LD, and is used for providing a forward bias voltage to the LD in the EML, wherein the forward bias voltage enables the LD to generate laser; a DC bias voltage circuit, which is connected to the cathode of the EAM in the EML, and is used for providing a positive DC bias voltage to the cathode and causing the reverse bias voltage of the EAM to fall within a predefined range of modulation; a ground wire, which is in AC coupling with the cathode of the EAM, i.e., the cathode is in AC coupling to ground, and the cathode is connected to the cathode of the LD. The output terminal of the driver in the EML and the cathode of the EAM are connected in AC coupling. The feedback control circuit utilizes the modulated optical signal as the first feedback signal and utilizes the bias current generated by the LD under drive of the forward bias voltage as the second feedback signal, and generates a voltage control signal $V_{CON}$ for controlling the drive circuit; under the drive of $V_{CON}$, the drive circuit regulates the forward bias voltage provided to the LD, so as to regulate the bias current in the LD.

As shown in FIG. 3, the feedback control circuit in the embodiment includes:

a bias current detecting circuit, which is used for detecting the bias current in the LD, and converting it into the first voltage signal $V_{BIAS}$ and outputting the first voltage signal; the drive circuit is partially serially connected to the LD, so the bias current in the LD can be generated by sampling the current of the serially connected part in the drive circuit;

a first amplifier, which is used for converting optical current Ipd output by the PD in the EML into the second voltage signal and amplifying the second voltage signal, wherein the PD is used for sensing the optical power of the modulated optical signal, and converting it into the optical current Ipd; the directly converted voltage signal is usually weak, so it is amplified by preset multiple; the first amplifier in the embodiment adopts the transimpedance amplifier, and the transimpedance amplifier is of negative feedback structure with high input impedance, which is featured in simple design and high bandwidth; the transimpedance gain of the transimpedance amplifier is adjusted through a 8-bit digital potentiometer; the output of the first amplifier is input to a comparator as the power feedback voltage;

a comparator, which is used for comparing the power feedback voltage with the preset power voltage $V_{SET}$, to generate a differential signal $V_{ERR}$; the preset power voltage is generated by amplifying the ideal power voltage by the same preset multiple; the preset power voltage in the embodiment of the disclosure is regulated through a 12-bit digital-to-analogue converter; and a feedback controller C(z), which is used for generating the voltage control signal for controlling the drive circuit and outputting, according to the differential signal $V_{ERR}$ generated by the comparator and the first voltage signal $V_{BIAS}$ output by the bias current detecting circuit; because the bias current in the LD determines the output optical power, when the active optical power error is generated through the differential signal $V_{ERR}$, the voltage control signal is generated by computing after generating the modulation direction according to the bias current detected by the bias current detecting circuit.

Figure 4:
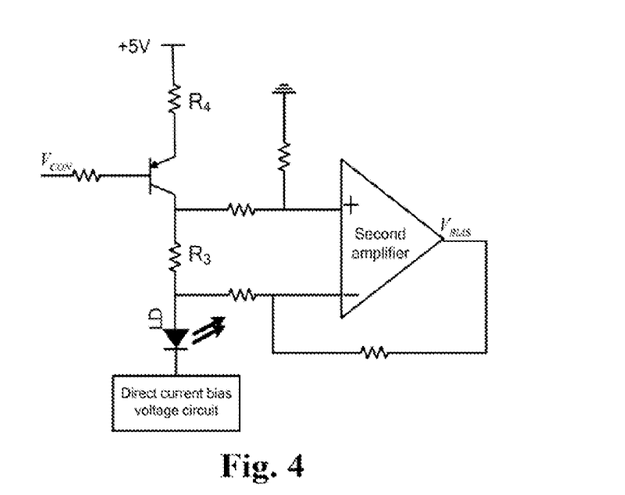
FIG. 4 shows an internal structural diagram and a connection circuit diagram of the drive circuit and the bias current detecting circuit in the embodiment of the disclosure.

The drive circuit in the embodiment of the disclosure adopts the transistor drive circuit; as shown in FIG. 4, the transistor drive circuit consists of a positive power reference, a transistor, a limiting resistor R4 and a current sampling resistor $R_3$; the positive power reference is +5V. The base voltage of the transistor is controlled by the output of the feedback controller, thereby to control the collector current of the transistor; and then the collector current drives the LD. The base of the transistor is connected to the voltage control signal; the collector is connected to the anode of the LD to provide the forward bias voltage to it; and the emitter is connected to the positive power. Thus, the feedback controller controls the voltage of base of the transistor according to the differential signal $V_{ERR}$ and the first voltage signal $V_{BIAS}$ detected by the bias current detecting circuit; and then the transistor utilizes the collector current to drive the LD, wherein the current in collector of the transistor is the bias current. The bias current detecting circuit includes: the current sampling resistor $R_3$, which is serially connected to the collector of the transistor; and the second amplifier, whose two input ends are connected to two ends of the $R_3$, respectively, and which is used for converting the current in the $R_3$ into the voltage signal, amplifying and outputting the first voltage signal. Through the design, sampling of the bias current in the LD is achieved.

Figure 5:
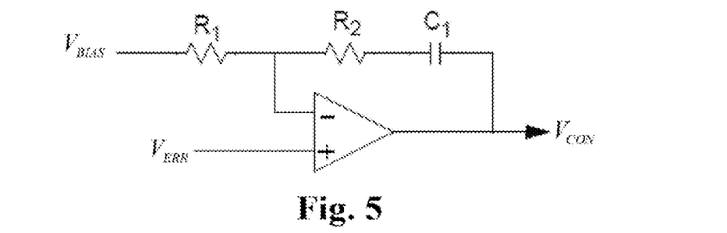
FIG. 5 shows a circuit diagram when the feedback controller adopts a proportional-integral control circuit in the embodiment of the disclosure.

The feedback controller in the embodiment adopts a proportional-integral control circuit, and utilizes the proportional-integral control algorithm to generate the voltage control signal $V_{CON}$ according to the differential signal $V_{ERR}$ and the first voltage signal $V_{BIAS}$ detected by the bias current detecting circuit. As shown in FIG. 5, the proportional-integral control circuit includes:

a third amplifier, whose inverting input terminal is connected to the first voltage signal $V_{BIAS}$ via the first resistor R1, non-inverting input terminal is connected to the differential signal $V_{ERR}$, output terminal is connected to the inverting input terminal via the serially connected first capacitor $C_1$ and the second resistor $R_2$; the $R_1$ and $R_2$ form the proportional part, the $R_1$ and $C_1$ form the integral part; the proportional coefficient and the integral coefficient are adjusted by modifying parameters of the three resistance-capacitance components, thereby to optimizing the performance of system. The proportional coefficient is equal to $R_2/R_1$, and the integral coefficient is equal to $1/R_1C_1$. The voltage control signal $V_{CON}$ output by the output terminal of the third amplifier is:

$V_{CON}=V_{ERR}-((1+R_2C_1S)/R_1C_1S)V_{BIAS}$, where S is set to be a complex variable.

The bias circuit of EML in the embodiment is used for providing the bias current to the LD and providing the reverse bias voltage to the EAM, and is connected to the EML through the peripheral interface of the packaged circuit board. As shown in FIG. 3, the EML includes: the driver, the EAM, the LD and the PD; the bias circuit of EML includes the DC bias voltage circuit providing the DC bias voltage to the EAM and the drive circuit providing the bias current to the LD, and the first amplifier, the comparator, the feedback controller and the bias current detecting circuit in the feedback control circuit for controlling the drive circuit. In the disclosure, the circuit which provides the DC bias voltage to the EAM and the circuit which provides the DC bias current to the LD are integrated, i.e., the cathode of the EAM and the cathode of the LD are connected. The cathode of the EAM and the cathode of the LD are connected to the DC bias voltage circuit, so, as shown in FIG. 3, the DC bias voltage circuit provides a circuit for the bias current.

Figure 6:
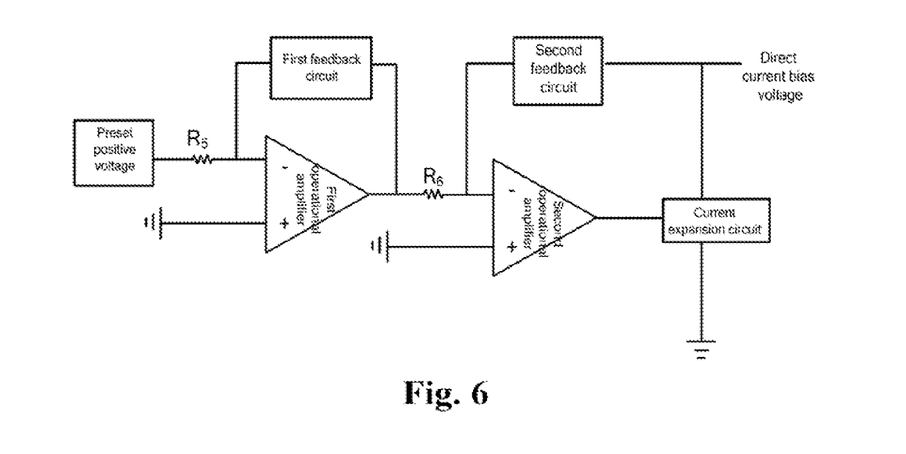
FIG. 6 shows a circuit diagram of a DC bias voltage circuit in the embodiment of the disclosure.

The preset positive voltage is from a digital component which is supplied with power only by the positive power, the polarity of voltage generated by the first-stage operational amplifier is opposite to the initial polarity of voltage, but the DC bias voltage is required to be positive voltage, so the polarity is needed to be reversed again, which means a two-stage amplifier is needed. The DC bias voltage circuit in the embodiment includes the first operational amplifier (called the first OPA for short) and the second operational amplifier (called the second OPA for short); the inverting terminal of the first OPA is connected to the preset positive voltage, and the output terminal of the second OPA is connected to the cathode of the EAM via a current expansion circuit; the first operational amplifier and the second operational amplifier which are connected in cascade form a non-inverting proportional amplifying circuit; the preset positive voltage is input to the cathode of EAM via the non-inverting proportional amplifying circuit. As shown in FIG. 6, the structure of the DC bias voltage circuit in the embodiment is that: the non-inverting terminal of the first OPA is grounded, and the inverting terminal is connected to the preset positive voltage via the first input resistor $R_5$; the output terminal of the first OPA is connected to the inverting terminal via the first feedback circuit; the first input resistor $R_5$ of the inverting terminal and the resistor in the first feedback circuit form the inverting proportional amplifying circuit, so the output voltage of the first OPA is equal to the preset positive voltage and opposite to it in polarity; the non-inverting terminal of the second OPA is grounded, and the inverting terminal is connected to the output terminal of the first OPA via the second input resistor $R_6$; the output terminal of the second OPA is connected to the input terminal of the current expansion circuit; the output terminal of the current expansion circuit is connected to the inverting terminal of the second OPA via the second feedback circuit, so the DC bias voltage output by the current expansion circuit is equal to the preset positive voltage and same as it in polarity. The second input resistor $R_6$ at the inverting terminal of the second OPA and the resistor in the second feedback circuit form the inverting proportional amplifying circuit, so the current expansion circuit is used for performing current expansion to the output of the second OPA; and the output terminal of the current expansion circuit is connected to the cathode of the EAM. The current expansion circuit in the embodiment is realized by adopting a PNP transistor; the collector of the PNP transistor is connected to the cathodes of LD and EAM as the output end, the base is connected to the output of the second-stage operational amplifier as the input end, and the emitter is grounded. The preset positive voltage is a positive voltage with adjustable range, and its adjustable range determines the adjustable range of the finally output positive voltage; the preset positive voltage is determined by the reference voltage and value of the digital potentiometer; the DC bias voltage of EAM can be dynamically regulated by adjusting the value of the digital potentiometer, and the adjusting range is preferably 0-1.8V.

Figure 7:
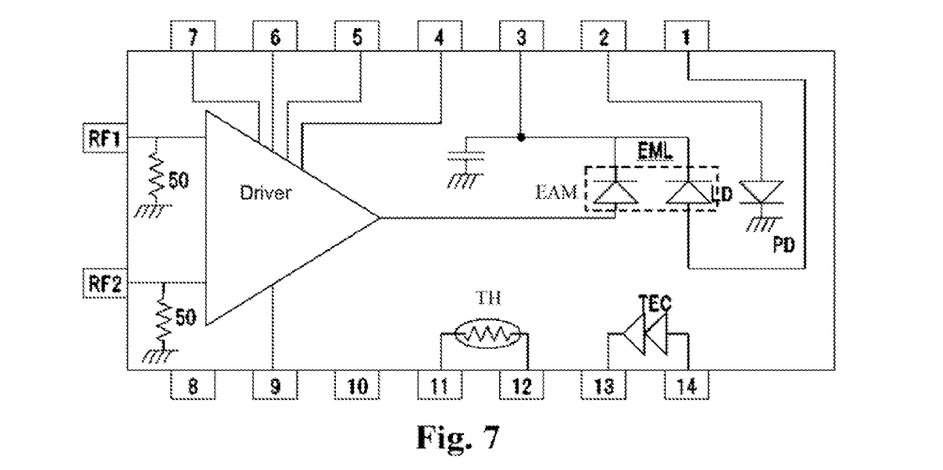
FIG. 7 shows a package diagram of the EML in the embodiment of the disclosure.

Taking the bias circuit of the 40G EML as example, FIG. 7 shows a package diagram of the EML; the EML mainly adopts a 14-pin butterfly-shaped package structure, and includes the driver, the EAM, the LD, the PD, and the negative temperature coefficient thermistor TH and TEC cooler for temperature control of chip of the EAM. The RF1 and RF2 are the high-speed differential AC signal, but the amplitude of signal is small, so it can drive the EAM only after being amplified by the driver. The LD and PD of the EML, and the transimpedance amplifier, the comparator, the feedback controller and the transistor drive circuit in the bias circuit form a feedback control loop with the DC bias current detecting circuit, so as to perform closed-loop control to the bias current of the laser. By testing the 40G EML which adopts the circuit, the power consumptions of the driver at 70 degrees centigrade and the TEC are 1.5 W and 0.5 W, respectively; the jitter of the output optical signal eye-diagram is small, the margin of eye-diagram is 16%, and the dispersion cost is less than 1.0 dB after 40 ps/nm transmission.

Figure 8:
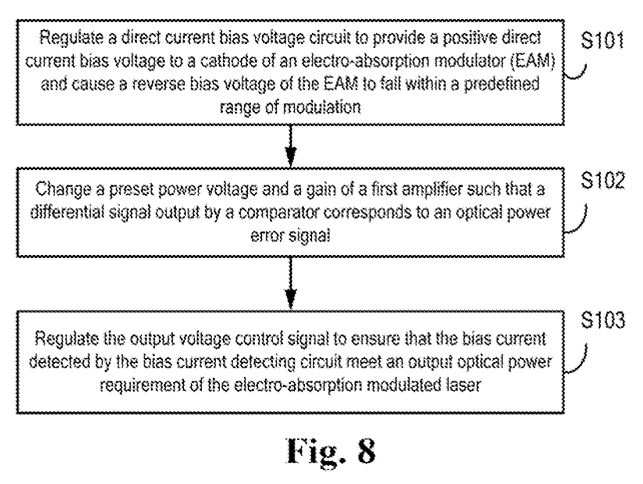
FIG. 8 shows a flowchart of a calibration method for the EML provided by the disclosure.

The calibration method for the bias circuit of an EML in the embodiment 2 of the disclosure is used for calibrating the bias circuit of an EML in the embodiment 1; as shown in FIG. 8, the method comprises the following steps:

S101: regulating a direct current bias voltage circuit to provide a positive direct current bias voltage to a cathode of an electro-absorption modulator and cause a reverse bias voltage of the electro-absorption modulator to fall within a predefined range of modulation; in the embodiment, the positive DC bias voltage which is provided to the cathode of the EAM by the DC bias voltage circuit can be changed by regulating the preset positive voltage, wherein regulating the preset positive voltage can be realized by adjusting value of the 8-bit digital potentiometer;

S102: changing a preset power voltage and a gain of a first amplifier such that a differential signal output by a comparator corresponds to an optical power error signal; the preset power voltage can be changed by adjusting value of the 12-bit digital-to-analogue converter, and the gain of the transimpedance amplifier is changed by adjusting the value of the 8-bit digital potentiometer in the transimpedance amplifier circuit, so as to enable the gain of the transimpedance amplifier to be equal to the gain of the ideal power voltage, thereby ensuring the output differential signal is the power error signal; and S103: utilizing the differential signal output by the comparator and a first voltage signal output by a bias current detecting circuit to control a voltage control signal output by a feedback controller, to ensure that a bias current detected by the bias current detecting circuit meet an output optical power requirement of the EML.

Obviously, the skilled personnel in the field can perform various modifications and equivalent replacements on the disclosure without departing from the scope and spirit of the disclosure. Thus, provided that these modifications and equivalent replacements of the disclosure are within the scope of the claims of the disclosure and equal technology thereof, the disclosure is intended to comprise these modifications and equivalent replacements.

The invention claimed is:

1. A bias circuit coupled to an electro-absorption modulated laser, including:
   a drive circuit, which is used for providing a forward bias voltage to a laser diode in the electro-absorption modulated laser, wherein the forward bias voltage enables the laser diode to generate laser;
   a direct current bias voltage circuit, which is connected to a cathode of an electro-absorption modulator in the electro-absorption modulated laser, wherein the direct current bias voltage circuit is used for providing a positive direct current bias voltage to the cathode of the electro-absorption modulator and causing a reverse bias voltage of the electro-absorption modulator to fall within a predefined range of modulation such that, when the reverse bias voltage falls within the predefined range of modulation, the electro-absorption modulator utilizes the laser generated by the laser diode as an optical carrier wave, modulates the optical carrier wave with a modulation voltage, and outputs a modulated optical signal; and
   a feedback control circuit, used for generating a voltage control signal for controlling the drive circuit according to the modulated optical signal and a bias current, wherein the bias current is generated by the laser diode under drive of the forward bias voltage; wherein, under control of the voltage control signal, the drive circuit regulates the forward bias voltage provided to the laser diode so as to regulate the bias current in the laser diode;
   wherein the feedback control circuit includes:
   a bias current detecting circuit, which is used for detecting the bias current in the laser diode, and converting it into a first voltage signal and outputting the first voltage signal;
   a first amplifier, which is used for converting an optical current output by a photo-detector in the electro-absorption modulated laser into a second voltage signal and amplifying the second voltage signal, wherein the photo-detector is used for sensing an optical power of the modulated optical signal, and converting it into the optical current;

a comparator, which is used for treating the amplified second voltage signal as a power feedback voltage, and comparing the amplified second voltage signal with a preset power voltage to generate a differential signal; and a feedback controller, which is used for generating the voltage control signal for controlling the drive circuit, according to the differential signal generated by the comparator and the first voltage signal output by the bias current detecting circuit, and outputting the voltage control signal.

2. The bias circuit coupled to an electro-absorption modulated laser according to claim 1, wherein the drive circuit includes a transistor, wherein a base of the transistor is connected to the voltage control signal, a collector of the transistor is connected to an anode of the laser diode and provides the forward bias voltage thereto, and an emitter of the transistor is connected to a positive power.

3. The bias circuit coupled to an electro-absorption modulated laser according to claim 2, wherein the bias current detecting circuit further includes:
    a current sampling resistor, which is serially connected to the collector of the transistor; and
    a second amplifier, whose two input ends are connected to two ends of the current sampling resistor, respectively, and which is used for converting a current in the current sampling resistor into a voltage signal, amplifying and outputting the voltage signal as the first voltage signal.

4. The bias circuit coupled to an electro-absorption modulated laser according to claim 1, wherein the feedback control circuit further includes a proportional-integral control circuit which includes:
    a third amplifier, whose inverting input terminal is connected to the first voltage signal via a first resistor, whose non-inverting input terminal is connected to the differential signal, and whose output terminal is connected to the inverting input terminal via serially connected first capacitor and second resistor; wherein a voltage control signal at the output terminal of the third amplifier is defined as:

$$V_{CON}=V_{ERR}-((1+R_2C_1S)/R_1C_1S)V_{BIAS}$$

where $V_{CON}$ is the voltage control signal, $R_1$ is the first resistor, $R_2$ is the second resistor, $C_1$ is the first capacitor, $V_{ERR}$ is the differential signal, $V_{BIAS}$ is the first voltage signal, and S is a complex variable.

5. The bias circuit coupled to an electro-absorption modulated laser according to claim 1, wherein,
    the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and
    the first operational amplifier and the second operational amplifier are connected in cascade to form a non-inverting proportional amplifying circuit.

6. The bias circuit coupled to an electro-absorption modulated laser according to claim 5, wherein,
    a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;
    a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and
    the current expansion circuit is used for performing current expansion to an output of the second operational amplifier; and an output terminal of the current expansion circuit is connected to the cathode of the electro-absorption modulator.

7. The bias circuit coupled to an electro-absorption modulated laser according to claim 1, further including:
    a ground wire, which is in an alternating-current coupling with the cathode of the electro-absorption modulator, wherein the cathode of the electro-absorption modulator is connected to a cathode of the laser diode.

8. The bias circuit coupled to an electro-absorption modulated laser according to claim 1, wherein,
    the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and
    the first operational amplifier and the second operational amplifier are connected in cascade to form a non-inverting proportional amplifying circuit.

9. The bias circuit coupled to an electro-absorption modulated laser according to claim 8, wherein,
    a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;
    a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and the current expansion circuit is used for performing current expansion to an output of the second operational amplifier; and an output terminal of the current expansion circuit is connected to the cathode of the electro-absorption modulator.

10. The bias circuit coupled to an electro-absorption modulated laser according to claim 1, wherein, the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and the first operational amplifier and the second operational amplifier are connected in cascade to form a non-inverting proportional amplifying circuit.

11. The bias circuit coupled to an electro-absorption modulated laser according to claim 10, wherein, a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;

a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and the current expansion circuit is used for performing current expansion to an output of the second operational amplifier; and an output terminal of the current expansion circuit is connected to the cathode of the electro-absorption modulator.

12. The bias circuit coupled to an electro-absorption modulated laser according to claim 2, wherein, the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and the first operational amplifier and the second operational amplifier are connected in cascade to form a non-inverting proportional amplifying circuit.

13. The bias circuit coupled to an electro-absorption modulated laser according to claim 12, wherein, a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;

a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and the current expansion circuit is used for performing current expansion to an output of the second operational amplifier; and an output terminal of the current expansion circuit is connected to the cathode of the electro-absorption modulator.

14. The bias circuit coupled to an electro-absorption modulated laser according to claim 3, wherein, the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and the first operational amplifier and the second operational amplifier are connected in cascade to form a non-inverting proportional amplifying circuit.

15. The bias circuit coupled to an electro-absorption modulated laser according to claim 14, wherein, a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;

a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and the current expansion circuit is used for performing current expansion to an output of the second operational amplifier; and an output terminal of the current expansion circuit is connected to the cathode of the electro-absorption modulator.

16. The bias circuit coupled to an electro-absorption modulated laser according to claim 4, wherein, the direct current bias voltage circuit further includes a first operational amplifier and a second operational amplifier which are connected in cascade, wherein an inverting terminal of the first operational amplifier is connected to a preset positive voltage, and an output terminal of the second operational amplifier is connected to the cathode of the electro-absorption modulator via a current expansion circuit; and the first operational amplifier and the second operational amplifier are connected in cascade to form a non-inverting proportional amplifying circuit.

17. The bias circuit coupled to an electro-absorption modulated laser according to claim 16, wherein, a non-inverting terminal of the first operational amplifier is grounded, an inverting terminal of the first operational amplifier is connected to a preset positive voltage via a first input resistor, and an output terminal of the first operational amplifier is connected to the inverting terminal of the first operational amplifier via a first feedback circuit; and the first input resistor at the inverting terminal and a resistor in the first feedback circuit form an inverting proportional amplifying circuit;

a non-inverting terminal of the second operational amplifier is grounded, and an inverting terminal of the second operational amplifier is connected to an output terminal of the first operational amplifier via a second input resistor; an output terminal of the second operational amplifier is connected to an input terminal of the current expansion circuit; an output terminal of the current expansion circuit is connected to an inverting terminal of the second operational amplifier via a second feedback circuit; and the second input resistor at the inverting terminal of the second operational amplifier and a resistor in the second feedback circuit form an inverting proportional amplifying circuit; and the current expansion circuit is used for performing current expansion to an output of the second operational amplifier; and an output terminal of the current expansion circuit is connected to the cathode of the electro-absorption modulator.

18. A calibration method for a bias circuit coupled to an electro-absorption modulated laser, comprising the following steps:

regulating a direct current bias voltage circuit to provide a positive direct current bias voltage to a cathode of an electro-absorption modulator and cause a reverse bias voltage of the electro-absorption modulator to fall within a predefined range of modulation;

changing a preset power voltage and a gain of a first amplifier such that a differential signal output by a comparator corresponds to an optical power error signal; and utilizing the differential signal output by the comparator and a first voltage signal output by a bias current detecting circuit to control a voltage control signal output by a feedback controller, to ensure that a bias current detected by the bias current detecting circuit meet an output optical power requirement of the electro-absorption modulated laser.

* * * * *